United States Patent
White et al.

(10) Patent No.: US 6,280,790 B1
(45) Date of Patent: *Aug. 28, 2001

(54) REDUCING THE DEPOSITION RATE OF VOLATILE CONTAMINANTS ONTO AN OPTICAL COMPONENT OF A SUBSTRATE PROCESSING SYSTEM

(75) Inventors: Anthony F. White, Cupertino; Satheesh Kuppurao, Santa Clara; Brian L. Haas, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,192

(22) Filed: Jun. 30, 1997

(51) Int. Cl.⁷ .................................................. C23C 16/00
(52) U.S. Cl. ......................... 427/8; 427/248.1; 118/712; 118/715; 156/345
(58) Field of Search ................................ 118/715, 712; 156/345; 427/8, 248.1

(56) References Cited

U.S. PATENT DOCUMENTS

| 4,976,996 | * | 12/1990 | Monkowski et al. | 427/255.5 |
| 5,062,386 | | 11/1991 | Christensen | 118/725 |
| 5,574,247 | | 11/1996 | Eisuke et al. | 118/708 |
| 5,653,808 | * | 8/1997 | MacLeish et al. | 118/715 |
| 5,755,886 | * | 5/1998 | Wang et al. | 118/715 |
| 5,755,888 | * | 5/1998 | Torii et al. | 118/719 |
| 5,884,412 | * | 3/1999 | Teitz et al. | 34/58 |
| 6,103,014 | * | 8/2000 | Lei et al. | 118/715 |

FOREIGN PATENT DOCUMENTS

| EP 0825 279 A1 | 2/1998 | (EP) . |
| FR 1553985 | 1/1969 | (FR) . |
| JP 59058326 | 4/1984 | (JP) . |
| JP 01312078 | 12/1989 | (JP) . |
| WO 9637763 A | 11/1996 | (WO) . |

* cited by examiner

Primary Examiner—Richard Bueker
(74) Attorney, Agent, or Firm—Pennie & Edmonds, LLP (57) ABSTRACT

A system and a method for reducing the rate at which volatile contaminants are deposited onto one or more optical components of a substrate processing system are disclosed. A purge fluid is introduced into the processing system at an interior surface of the processing system. A flow of purge fluid is produced across the interior surface to form a contaminant-entraining barrier between a source of the volatile contaminants and the one or more optical components and thereby reduce the rate at which volatile contaminants are deposited onto the optical components of the system. The purge fluid is substantially removed from the processing system.

16 Claims, 7 Drawing Sheets

REDUCING THE DEPOSITION RATE OF VOLATILE CONTAMINANTS ONTO AN OPTICAL COMPONENT OF A SUBSTRATE PROCESSING SYSTEM

CROSS REFERENCE TO RELATED APPLICATIONS

This application relates to the following applications, each of which is assigned to the assignee of this application and is incorporated herein by reference: U.S. Pat. No. 5,884,412 entitled "Method and Apparatus for Purging the Back Side of a Substrate During Chemical Vapor Processing;" U.S. Pat. No. 5,781,693 entitled "Novel Way of Introducing Gas into an RTP Chamber;" U.S. Ser. No. 08/359,302, filed Dec. 19, 1994, now U.S. Pat. No. 5,660,472, and entitled "A Method and Apparatus for Measuring Substrate Temperatures;" Bierman et al., U.S. Ser. No. 08/858,089 filed May 16, 1997, now U.S. Pat. No. 6,035,100 and entitled "Apparatus and Methods for Processing a Substrate While Reducing Depositions on a Reflector;" Tietz et al., U.S. Ser. No. 08/879,497, filed May 16, 1997, now U.S. Pat. No. 6,157,106, and entitled "Magnetically-Levitated Rotor System for an RTP Chamber;" and Deaton et al., U.S. Ser. No. 08/858,091, filed May 16, 1997, now U.S. Pat. No. 5,960,555, and entitled "Method and Apparatus for Purging the Back Side of a Substrate During Chemical Vapor Processing." This application also relates to U.S. Pat. No. 5,155,336, issued Oct. 13, 1992, which is also incorporated herein by reference

BACKGROUND OF THE INVENTION

The invention relates to a system and a method for reducing the deposition rate of volatile contaminants onto an optical element of a substrate processing system.

Substrate processing systems are used to fabricate semiconductor logic and memory devices, flat panel displays, CD ROMs, and other devices. During processing, such substrates may be subjected to chemical vapor deposition (CVD) and rapid thermal processes (RTP). RTP processes include, for example, such rapid thermal annealing (RTA), rapid thermal cleaning (RTC), rapid thermal CVD (RTCVD), rapid thermal oxidation (RTO), and rapid thermal nitridation (RTN). RTP systems usually include a heating element formed from one or more lamps which radiatively heat the substrate through a light-transmissive window; RTP systems may also include one or more other optical elements, such as an optically reflective surface facing the backside of the substrate and one or more optical detectors for measuring the temperature of the substrate during processing.

Layers of doped glass, such as borophosphosilicate glass (BPSG) or phosphosilicate glass (PSG), are used extensively in pre-metal dielectric (PMD) layers in logic and memory devices. Doped glass layers are typically deposited onto a substrate in a CVD system and are subsequently heated to a high temperature in an RTP chamber or a furnace. In one heating process, doped glass is densified by heating the doped glass to a temperature of 700–800° C. in an RTP chamber. Heating the doped glass in this way reduces the porosity of the layer, relieves stress in the film, drives off residual impurities left from CVD deposition, stabilizes the dopants against atmospheric instability, and activates the gettering capability of the phosphorous oxides ($PO_x$) in the film for trapping alkali ions. BPSG can be heated to higher temperatures, such as 850–950° C., to decrease the viscosity of the BPSG and cause macroscopically visible flow (reflow) that planarizes the BPSG surface and enables the BPSG to fill surface features of underlying layers.

Various volatile contaminants are produced during an RTP process as a result of heating a substrate to a high temperatures. These volatile contaminants can condense onto the walls and other surfaces inside the processing chamber and, over time, the build-up of such deposits may detrimentally impact the operation of the processing system. For example, boron oxides ($BO_x$) and $PO_x$ have high vapor pressures and are produced at a rapid rate when BPSG and PSG layers are heated to high temperatures. To reduce the detrimental impact of these volatile contaminants upon the fabrication process, such RTP systems must be periodically shutdown and cleaned. Replaceable liners (and the like) have been developed for reducing the time needed to clean the processing chamber.

SUMMARY OF THE INVENTION

In one aspect, the invention features a scheme for reducing the rate at which volatile contaminants are deposited onto one or more optical components of a substrate processing system. According to the invention, a purge fluid is introduced into the processing system at an interior surface of the processing system, a flow of purge fluid is produced across the interior surface to form a contaminant-entraining barrier between a source of the volatile contaminants and the one or more optical components and thereby reduce the rate at which volatile contaminants are deposited onto the optical components of the system. The purge fluid is substantially removed from the processing system.

The purge fluid may flow across the interior surface of the processing system as a substantially laminar flow. The purge fluid may be introduced into the processing system from a peripheral region of the interior surface and directed toward a central region of the interior surface. The purge fluid may be introduced from a peripheral region of the interior surface and removed from a peripheral region at an opposite side of the interior surface. If the interior surface is substantially circular, the purge fluid may be introduced from different locations around the periphery of the interior surface. The purge fluid may removed from the processing system through an exhaust port in the interior surface. In one embodiment, the flow of purge fluid is produced by directing a flow of a purge fluid against a deflector spaced a distance from the interior surface of the processing system where the purge fluid is introduced. The one or more optical components may comprise an optical detector that receives radiation from inside the processing system that passes through an optical port, and the flow of purge fluid is directed toward the optical port. In one embodiment, the flow of purge fluid is produced by directing a flow of purge fluid against a slot-shaped deflector constructed to deflect the flow of purge fluid as a rectangular curtain of fluid across the optical port. The rectangular curtain of fluid may be removed from the processing chamber through a slot-shaped opening in the interior surface of the processing system. In another embodiment, the purge fluid is introduced from a circumferential region surrounding the optical port. The one or more optical components may comprise an optically reflective surface, and the flow of purge fluid is produced across this surface. The flow rate at which the purge fluid is introduced into the processing system is preferably substantially the same as the flow rate at which the purge fluid is removed from the processing system.

In another aspect, the invention features a scheme for processing a layer (such as doped glass) supported on a substrate. According to the invention, the substrate is heated inside a processing system having one or more optical components, a purge fluid is introduced into the processing system at an interior surface of the processing system, a substantially laminar flow of the purge fluid is produced across the interior surface to form a contaminant-entraining barrier between a source of the volatile contaminants and the one or more optical components, thereby reducing the rate at which volatile contaminants are deposited onto the optical components of the system, and purge fluid is removed from the processing system.

The contaminant-entraining barrier produced by the flow of purge fluid across the interior surface of the substrate processing system prevents volatile contaminants from contacting one or more optical components of the system. The invention thereby reduces the rate at which volatile contaminants condense onto the optical components and increases the number of substrates that can be processed before the processing system must be cleaned; in contrast, the use of a replaceable liner (and the like) to shield the optical components of the system does not extend the period between cleanings.

Other features and advantages will become apparent from the following.

DESCRIPTION OF THE PREFERRED EMBODIMENTS

Figure 1:
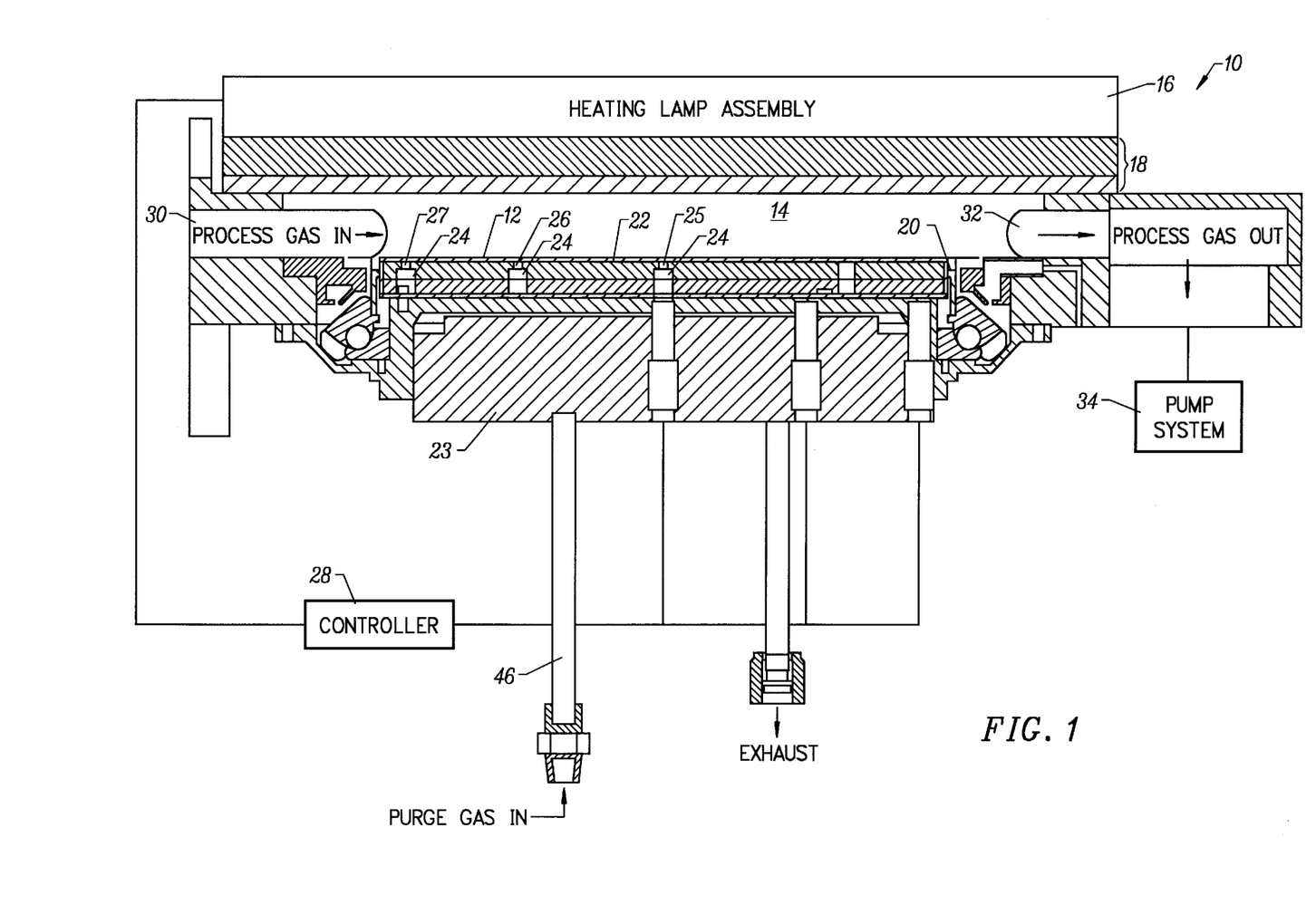
FIG. 1 is a diagrammatic side view of a substrate processing system.

Referring to FIG. 1, a system 10 for processing a substrate 12 may include a processing chamber 14 that is radiatively heated through a water-cooled quartz window 18 by a heating lamp assembly 16. The peripheral edge of substrate 12 is supported by a rotatable support structure 20, which can rotate at a rate of up to about 120 rpm (revolutions per minute). Beneath substrate 12 is a nickel-plated aluminum reflector plate assembly 22 that has an optically reflective surface facing the backside of substrate 12 to enhance the effective emissivity of substrate 12. In a system designed for processing eight-inch (200 mm) silicon wafers, reflector plate assembly has a diameter of about 8.9 inches, the separation between substrate 12 and the top surface of reflector plate assembly 22 is about 5–10 mm, and the separation between substrate 12 and quartz window 18 is about 25 mm. Reflector plate assembly 22 is mounted on a water-cooled base 23, which is typically maintained at a temperature of about 23° C.

The temperatures at localized regions of substrate 12 are measured by a plurality of temperature probes 24 which are positioned to measure substrate temperature at different radial locations across the substrate. Temperature probes 24 receive light from inside the processing chamber through optical ports 25, 26, and 27, which extend through the top surface of reflector plate assembly 22 (processing system 10 may have a total often temperature probes, only three probes are shown in FIG. 1). At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 12. Temperature measurements from the optical detectors are received by a controller 28 that controls the radiative output of heating lamp assembly 16; the resulting feedback loop improves the ability of the processing system to uniformly heat substrate 12.

Process gas is introduced into processing chamber 14 through a process gas input 30. The process gas flows across the top surface of substrate 12 and reacts with a heated substrate to form, for example, an oxide layer or a nitride layer. Excess process gas, as well as any reaction by-products (such as oxides given off by the substrate), are withdrawn from processing chamber 14 though a process gas output 32 by a pump system 34. Most of the excess process gas and reaction products can be pumped out of processing chamber 14; but some volatile contaminants, especially those with relatively high vapor pressures such as $BO_x$ and $POx$, leak into the optical cavity formed between the top surface of reflector plate assembly 22 and the backside of substrate 12. These contaminants can condense onto one or more optical components of system 10, such as the optically reflective surface of reflector plate assembly 22 and the surfaces of optical ports 26; over time, such deposits can detrimentally impact the operation of substrate processing system 10.

Figure 2:
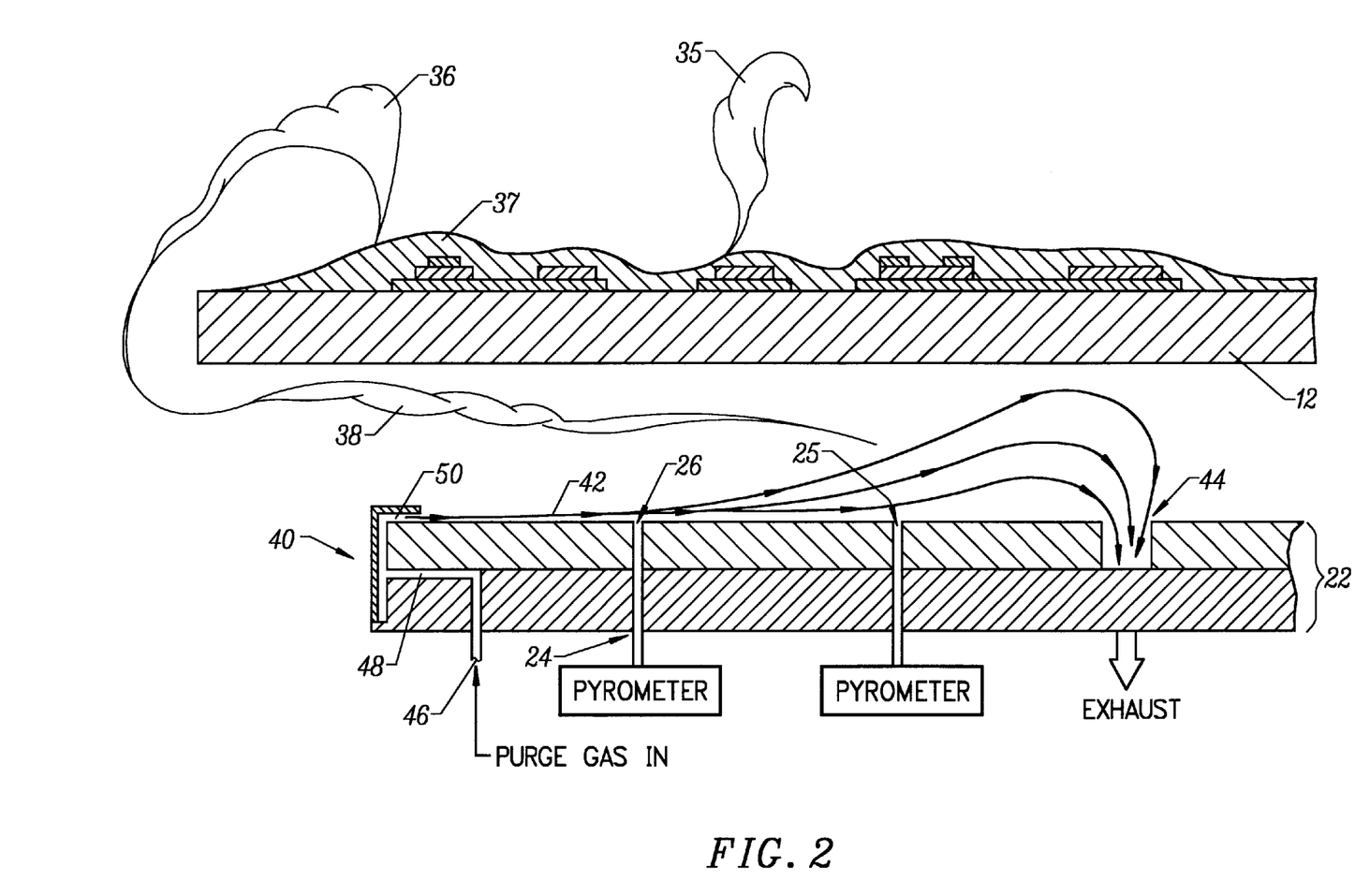
FIG. 2 is a diagrammatic side view of a fluid injector which produces a substantially laminar flow of a purge gas across a surface of a portion of a reflector plate assembly.

As shown in FIG. 2, volatile contaminants 35, 36 are given off from a doped glass layer 36 as substrate 12 is processed. Some volatile contaminants 38 leak into the space formed between the backside of substrate 12 and the top surface of reflector plate assembly 22. The inventors have realized that the rate at which volatile contaminants 38 are deposited onto optical components of processing system can be substantially reduced by a purge fluid injector 40 that produces a substantially laminar flow of a purge gas 42 across the top surface of reflector plate assembly 22. Purge gas 42 forms a contaminant-entraining barrier between substrate 12 and the optical components, whereby volatile contaminants 38 are entrained in the purge gas flow 42 and removed though an exhaust port 44, rather than condense on the optically reflective surface of reflector plate assembly 22. The exhaust port may have a diameter of about 0.375 inch and is located about 2 inches from the central axis of reflector plate assembly 22. In operation, purge gas is injected into a purge gas input 46 and is distributed through a plurality of channels 48 in reflector plate assembly 22. The purge gas is then directed against a deflector 50, which is spaced above the top surface of the reflector assembly by a distance, for example, of about 0.01 inch (0.25 mm), to produce the substantially laminar flow of purge gas 42. In one embodiment, the purge gas consists of an inert gas, such as nitrogen.

Figure 3A:
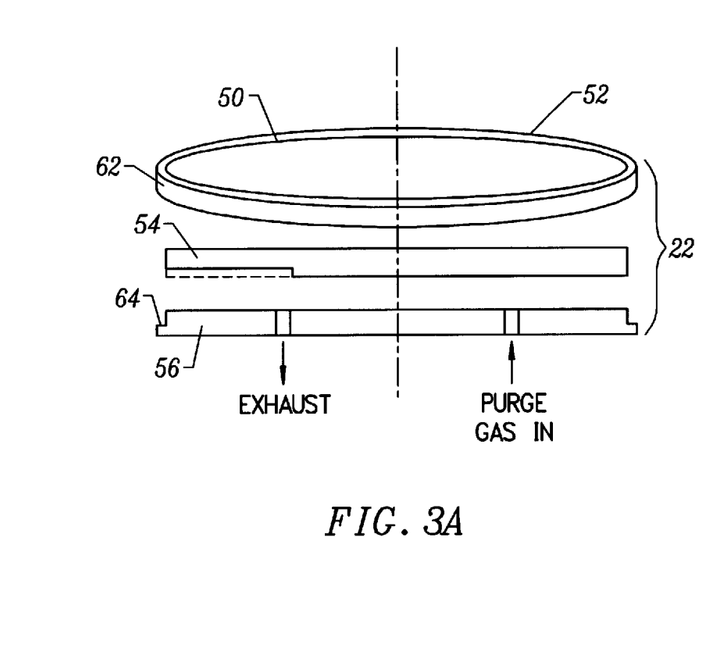
FIGS. 3A and 3B are exploded views of the reflector plate assembly and the fluid injector shown in FIG. 2.
Figure 3B:
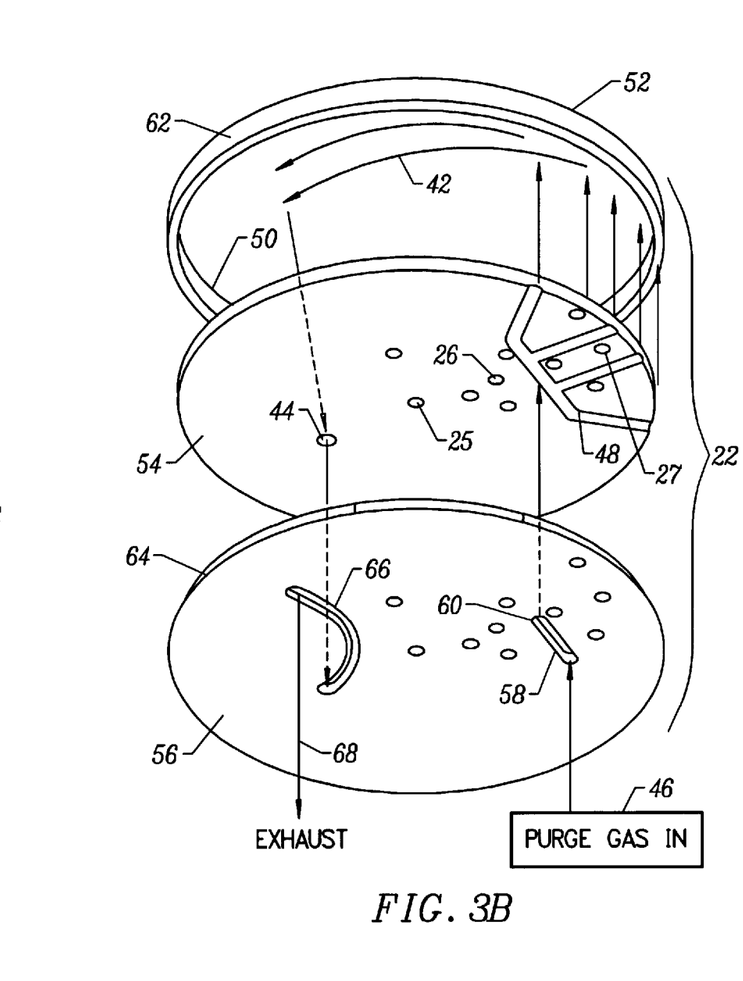

Referring to FIGS. 3A and 3B, reflector plate assembly 22 includes a deflector ring 52, a top reflector plate 54, and a bottom reflector plate 56. Bottom reflector plate 56 has a horizontal channel 58 for receiving purge gas from input 46 and for delivering the purge gas to a vertical channel 60, which communicates with a plurality of horizontal channels 48 in top reflector plate 54. Horizontal channels 48 distribute the purge gas to different locations at the periphery of top reflector plate 54. Deflector ring 52 includes a peripheral wall 62 which rests on a lower peripheral edge 64 of bottom reflector plate 56 and, together with the peripheral wall of top reflector plate 54, defines a 0.0075 inch wide vertical channel which directs the purge gas flow against deflector 50 to produce the substantially laminar flow of purge gas across the top surface of reflector plate 54. The purge gas and any entrained volatile contaminants are removed from the processing chamber through exhaust port 44. A horizontal channel 66 in bottom reflector plate 56 receives the exhausted gas from exhaust port 44 and directs the exhausted gas to a line 68 that is connected to a pump system. Each of the channels 48, 58, and 60 may have a cross-sectional flow area of about 0.25 inch by about 0.1 inch.

Figures 3C, 3D:
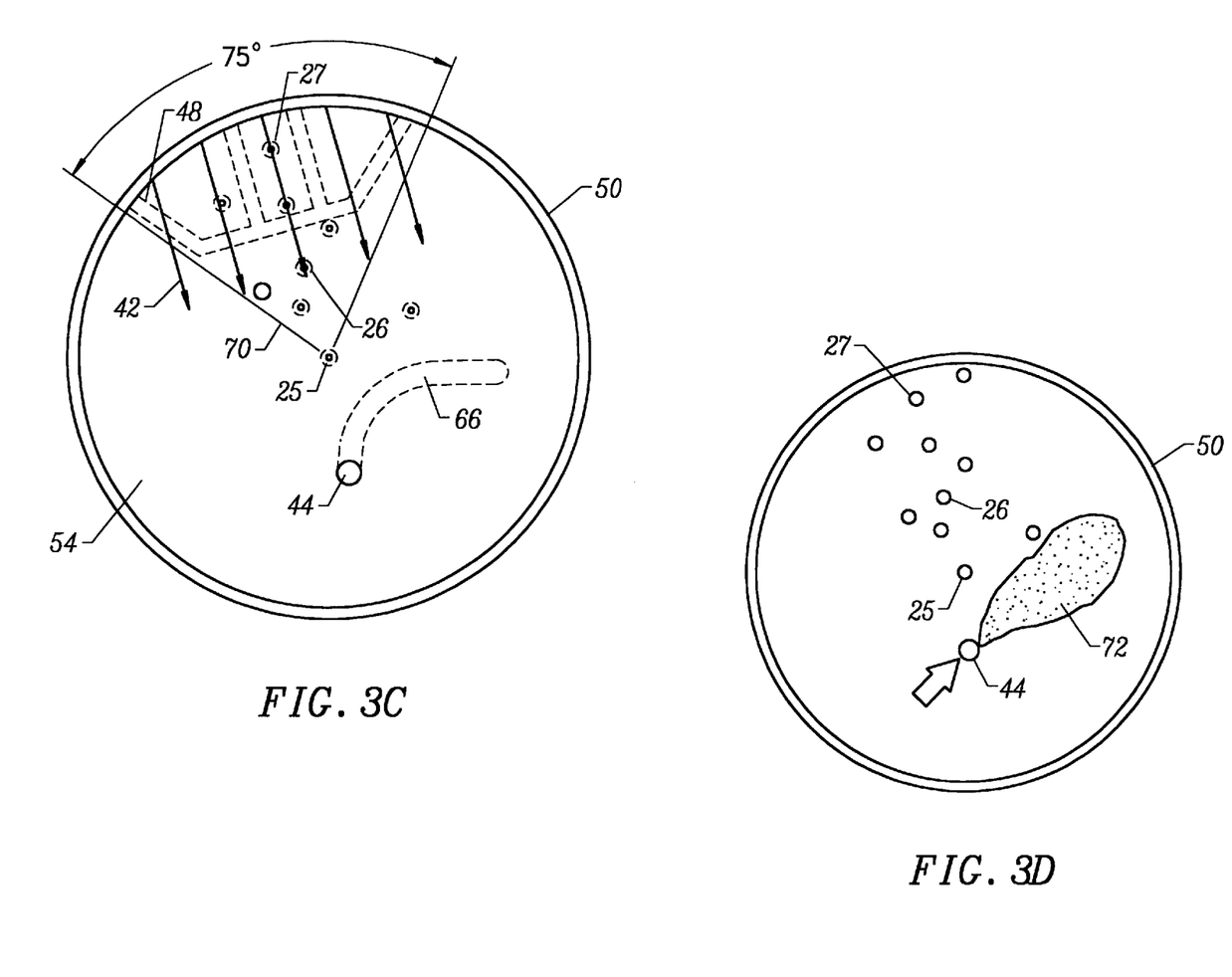
FIG. 3C is a diagrammatic top view of the reflector plate assembly and the fluid injector of FIG. 2; features of the bottom reflector plate are shown using dashed lines.
FIG. 3D is a diagrammatic top view of the reflector plate assembly and the fluid injector of FIGS. 3A and 3B after several substrates have been processed.

Referring to FIG. 3C, purge gas may be introduced at the top surface of top reflector plate 54 along a peripheral arc of about 75°. The resulting substantially laminar flow of purge gas 42 forms a contaminant-entraining barrier over a region of the top surface of top reflector plate 54 corresponding to the 75° sector 70, which includes nine of the ten optical ports in top reflector plate 54 (including optical ports 25, 26, and 27). As shown in FIG. 3D, after processing several substrates containing BPSG layers, it was observed that volatile contaminants condensed onto the top reflector plate only in a limited-area, tear-shaped region 72; the other regions of the top surface, including the locations of the optical ports, were substantially contamination-free.

Figure 3E:
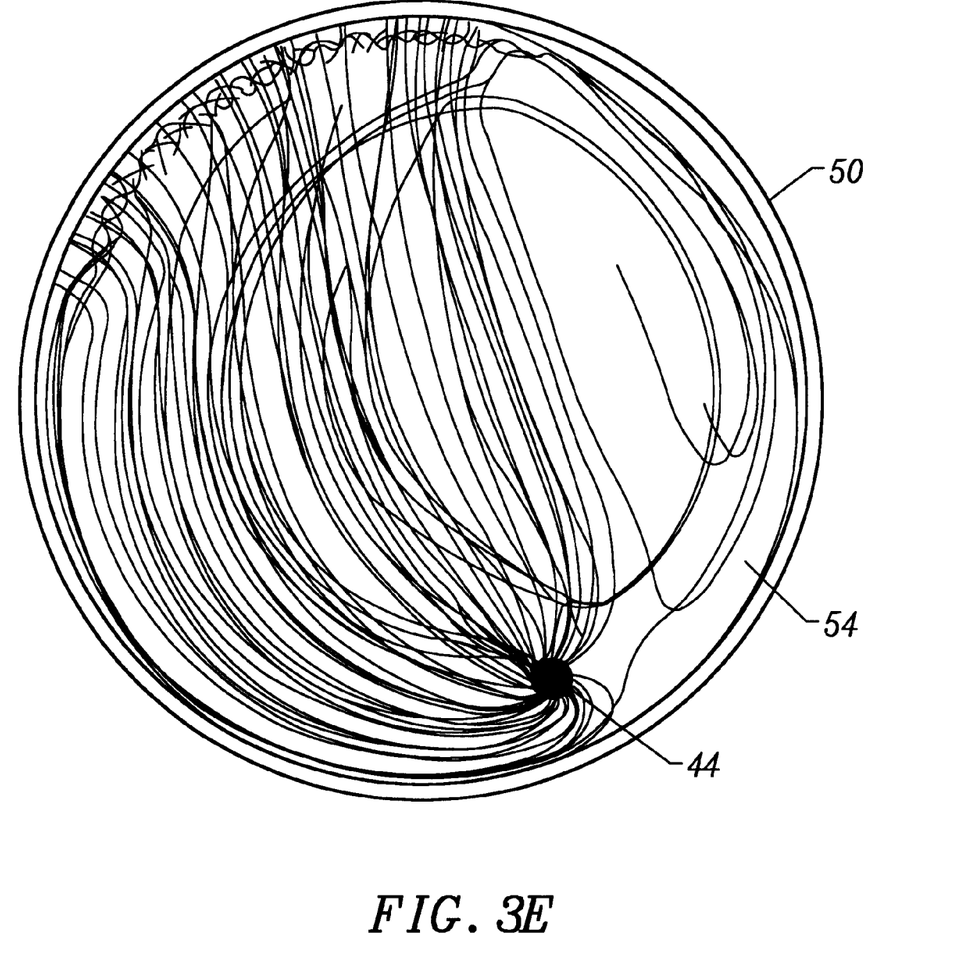
FIG. 3E is a diagrammatic top view of the reflector plate assembly and the fluid injector of FIGS. 3A and 3B, showing the air flow pattern of nitrogen purge gas at a distance of 2 mm above the surface of the reflector plate.

FIG. 3E illustrates the results of a computer simulation of nitrogen purge gas flow streamlines at a distance of 2 mm above the surface of top reflector plate 54. This simulation is based upon a nitrogen flow rate of 9 slm (standard liters per minute), a processing chamber pressure of 950 torr, a substrate temperature of 1050° C., a reflector assembly temperature of 78° C., and a substrate rotation rate of 90 rpm (revolutions per minute). As shown, flow near top reflector plate 54 is fairly direct from deflector 50 to exhaust port 44, although the rotation of substrate 12 tends to deflect the flow lines slightly. The region of top reflector plate 54 that receives the least purge gas flow corresponds to tear-shaped region 72 (FIG. 3D); that is, BPSG contamination of reflector plate 54 appears to occur in regions of low gas velocity where the contaminant-entraining barrier is not as effective at sweeping volatile contaminants toward exhaust port 44.

Figure 4:
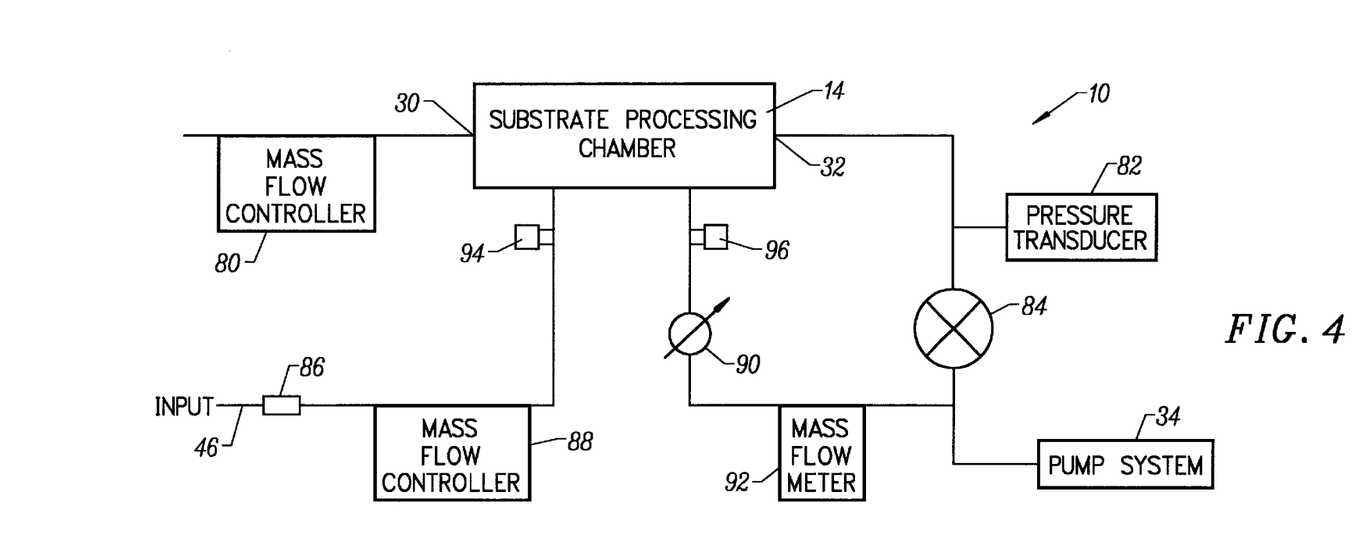
FIG. 4 is a diagrammatic view of the purge gas control system of the substrate processing system of FIG. 1.

The flow rates of purge gas and process gas are controlled by the fluid control system shown in FIG. 4. A mass flow controller 80 is used to regulate the flow of process gas into processing chamber 14, and a pressure transducer 82 and a pressure control valve 84 are used to regulate the rate at which process gas is removed from processing chamber 14. Purge gas is introduced into processing chamber 14 through input 46 which is connected to a filter 86. A mass flow controller 88 is used to regulate the flow of purge gas into processing chamber 14, and an adjustable flow restrictor 90 and a mass flow meter 92 are used to regulate the rate at which purge gas is removed from processing chamber 14. To reduce the migration of purge gas into the processing region of processing chamber 14, above substrate 12, flow restrictor 90 is adjusted until the rate at which purge gas is introduced into processing chamber 14 is substantially the same as the rate at which purge gas is removed from processing chamber 14. Solenoid shut-off valves 94 and 96 provide additional control over the flow of purge gas through processing chamber 14. In a system designed for processing eight-inch (200 mm) silicon wafers, nitrogen purge gas is flowed through processing chamber 14 at a rate of about 9–20 slm (standard liters per minute), although the purge gas flow rate can be varied depending upon the pressure inside processing chamber 14 and the pumping capacity of pump system 34. The pressure inside processing chamber 14 is typically about 950 torr.

Figure 5:
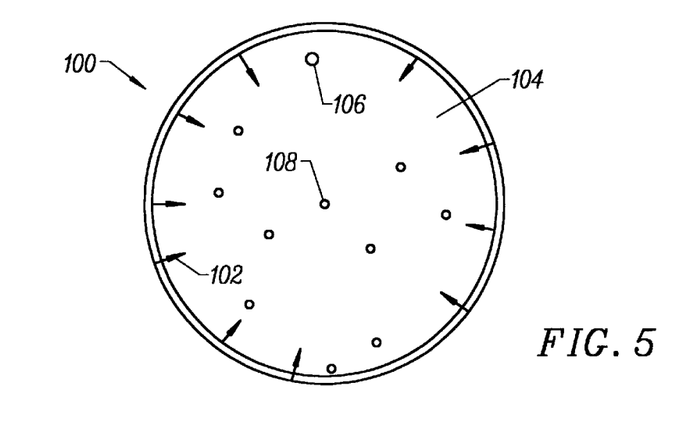
FIG. 5 is a diagrammatic top view of an alternative fluid injector.

Referring to FIG. 5, in another embodiment, a reflector plate assembly 100 is similar in construction to reflector plate assembly 22, except reflector plate assembly 100 is designed to introduce a purge gas 102 from different locations around the entire periphery of a top reflector plate 104. Purge gas 102 is removed through an exhaust port 106 that extends through top reflector plate 104. Purge gas 102 may be introduced at locations about 4.33 inches from the center of reflector plate 102, and exhaust port 106 may be located about 2 inches from the center of reflector plate 102. This embodiment may be used when optical ports 108 are distributed over the entire surface of reflector plate 102.

Figure 6A:
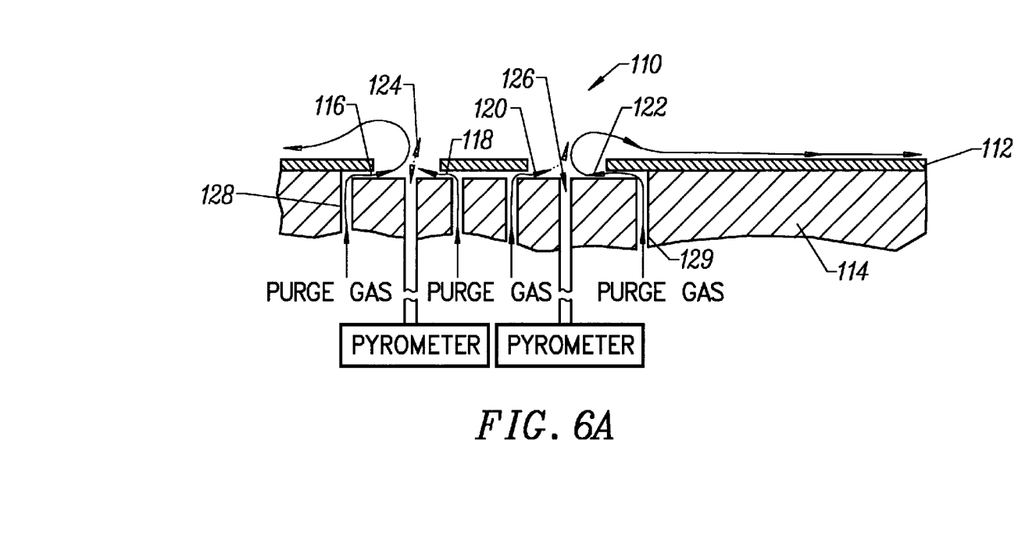
FIGS. 6A and 6B are diagrammatic side and top views of a portion of an alternative fluid injector, respectively.
Figure 6B:
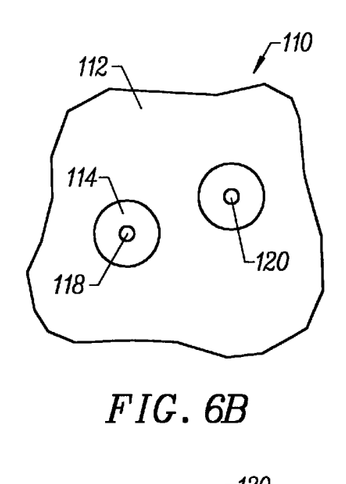

Referring to FIGS. 6A and 6B, in yet another embodiment, a reflector plate assembly 110 is also similar in construction to reflector plate assembly 22, except reflector plate assembly 110 includes a deflector plate 112 and a top reflector plate 114 that together define flow channels for producing a substantially laminar flow of purge gas in circumferential regions 116–122 surrounding optical ports 124 and 126. The purge gas flows through vertical annular channels 128, 129 in top reflector plate 114. The purge gas may be exhausted through an exhaust port (not shown) that extends through top reflector plate 114; the purge gas may alternatively be exhausted over the circumferential edge of reflector plate assembly 110. In this embodiment, the top surface of deflector plate 112 acts as the primary optically reflective surface that faces the backside of the substrate. Deflector plate 112 may be spaced above top reflector plate 114 by a distance of 0.01 inch (0.25 mm).

Figure 7A:
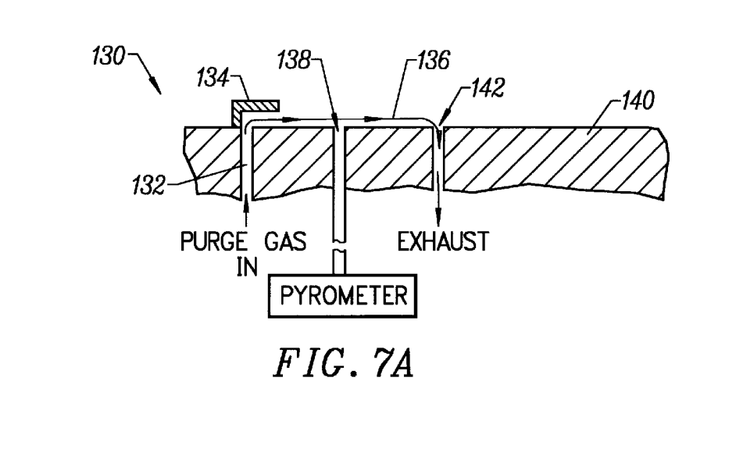
FIGS. 7A and 7B are diagrammatic side and top views of a portion of an alternative fluid injector, respectively.
Figure 7B:
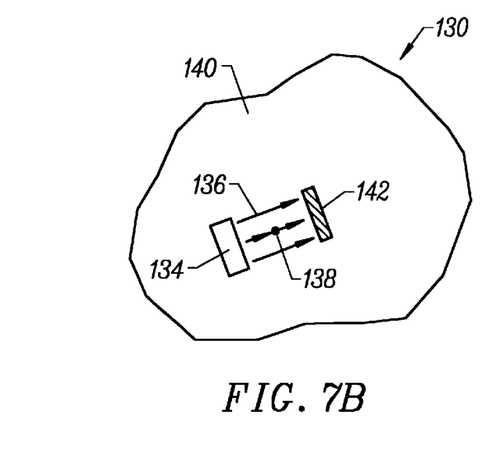

Referring to FIGS. 7A and 7B, in another embodiment, a reflector plate assembly 130 includes a vertical channel 132 for receiving a flow of a purge gas, and a slot-shaped deflector 134 for deflecting the flow of purge gas 136 as a rectangular curtain across an optical port 138 that extends through a reflector plate 140. A slot-shaped exhaust port 142 is used to remove purge gas 136. Deflector 134 may be spaced above the top surface of reflector plate 140 by a distance of about 0.01 inch (0.25 mm).

Systems and methods have been disclosed producing a contaminant-entraining barrier across the interior surface of a substrate processing system to prevent volatile contaminants from contacting and adhering to one or more optical components of the system. The present invention reduces the rate at which volatile contaminants condense onto the optical components and increases the number of substrates that can be processed before the processing system must be cleaned.

Other embodiments are within the scope of the claims.

What is claimed is:

1. A rapid thermal processing (RTP) system for processing a substrate, the RTP system comprising:

an edge ring to support the substrate in a processing chamber;

a heater to direct radiation toward a first side of the substrate to be processed;

a reflector having a surface facing a second side of the substrate to form a reflecting cavity therebetween, the reflector having one or more optical ports to receive radiation from inside the reflecting cavity;

a fluid injector constructed to receive a flow of a purge fluid and to introduce a purge fluid at the surface of the reflector in a direction that is substantially parallel to the surface of the reflector to form a contaminant-entraining barrier between a source of the volatile contaminants and the one or more optical ports, thereby reducing the rate at which volatile contaminants contaminate the one or more optical ports; and an exhaust to remove purge fluid from the RTP system.

2. A method for processing a substrate comprising the steps of:

supporting the substrate on an edge ring in a processing chamber, heating the substrate by directing radiation to a first side thereof to be processed, introducing a purge fluid into a reflecting cavity formed between a reflector and a second side of the substrate, the reflector having one or more optical components to receive radiation from the reflecting cavity, in a direction that is substantially parallel to a surface of the reflector to form a contaminant-entraining barrier between a source of the volatile contaminants at the first side of the substrate and the one or more optical components and thereby reduce the rate at which volatile contaminants are deposited onto the optical components, and removing purge fluid from the reflecting cavity.

3. The subject matter of claim 2 or 1 wherein the purge fluid flows across the surface of the reflector as a substantially laminar flow.

4. The subject matter of claim 2 or 1 wherein purge fluid is introduced into the reflecting cavity from a peripheral region of the surface of the reflector and the flow of purge fluid is directed toward a central region of the surface of the reflector.

5. The subject of claim 1 or 2 wherein the purge fluid is introduced from a peripheral region of the surface of the reflector and the purge fluid is removed from a peripheral region at an opposite side of the surface of the reflector.

6. The subject matter of claim 1 or 2 wherein the reflector is substantially circular and purge fluid is introduced from different locations around the periphery thereof.

7. The subject matter of claim 1 or 2 wherein purge fluid is removed from the reflecting cavity through an exhaust port in the surface of the reflector.

8. The subject matter of claim 1 or 2 wherein the flow of purge fluid is produced by directing a flow of a purge fluid against a deflector spaced a distance from the surface of the reflector.

9. The subject matter of claim 2 wherein the one or more optical components comprises an optical detector which receives radiation from inside the reflecting cavity that passes through an optical port, and the flow of purge fluid is directed toward the optical port.

10. The subject matter of claim 9 wherein the flow of purge fluid is produced by directing a flow of purge fluid against a slot-shaped deflector constructed to deflect the flow of purge fluid as a rectangular curtain of fluid across the optical port.

11. The subject matter of claim 10 wherein the rectangular curtain of fluid is removed from the processing chamber through a slot-shaped opening in the surface of the reflector.

12. The subject matter of claim 9 wherein the purge fluid is introduced from a circumferential region surrounding the optical port.

13. The subject matter of claim 2 wherein the one or more optical components comprises an optically reflective surface, and the flow of purge fluid is produced across the optically reflective surface.

14. The subject matter of claim 1 or 2 wherein the flow rate at which the purge fluid is introduced into the processing chamber is substantially the same as the flow rate at which the purge fluid is removed from the processing chamber.

15. The subject matter of claim 2 or 1 wherein a layer to be processed consists of doped glass.

16. An apparatus for processing a substrate, comprising:

a processing chamber;

one or more optical components;

a heater to direct radiation to a first side of the substrate;

a reflector plate having a top surface facing towards a second side of the substrate;

a deflector plate positioned above the top surface of the reflector plate to define an optically-reflective surface and a channel constructed to receive a flow of a purge fluid and to introduce purge fluid as a substantially laminar flow in a region around the one or more optical components to form a contaminant-entraining barrier between a source of the volatile contaminants and the one or more optical components and thereby reduce the rate at which volatile contaminants are deposited onto the one or more optical components, and wherein the deflector plate acts as the main optically-reflective surface; and an exhaust to remove purge fluid from the processing chamber.

* * * * *